United States Patent
Acker et al.

(10) Patent No.: US 6,538,878 B1
(45) Date of Patent: Mar. 25, 2003

(54) BUS BAR ASSEMBLY

(75) Inventors: Stefan Van Acker, Mariakerke (BE); Didier Leclercq, Lovendegem (BE)

(73) Assignee: World Properties, Inc., Lincolnwood, IL (US)

( * ) Notice: Subject to any disclaimer, the term of this patent is extended or adjusted under 35 U.S.C. 154(b) by 0 days.

(21) Appl. No.: 09/914,126

(22) PCT Filed: Feb. 22, 1999

(86) PCT No.: PCT/US99/03804
§ 371 (c)(1),
(2), (4) Date: Aug. 21, 2001

(87) PCT Pub. No.: WO00/51141
PCT Pub. Date: Aug. 31, 2000

(51) Int. Cl.[7] .................................................. H02B 1/26
(52) U.S. Cl. ................. 361/624; 174/72 B; 174/117 F; 174/260; 361/775; 361/713
(58) Field of Search .............................. 174/71 B, 72 B, 174/88 B, 117 F, 260, 6, 267; 361/690, 611, 775, 622, 713

(56) References Cited

U.S. PATENT DOCUMENTS

| | | | |
|---|---|---|---|
| 3,372,308 A | | 3/1968 | Noschese et al. ............ 317/101 |
| 4,694,123 A | | 9/1987 | Massey ....................... 174/117 |
| 4,809,153 A | * | 2/1989 | Bremer et al. .............. 361/611 |
| 5,053,920 A | | 10/1991 | Staffiere et al. ............. 361/383 |
| 5,184,280 A | * | 2/1993 | Fouad ........................ 361/611 |

OTHER PUBLICATIONS

G. Narramore, "Draft Procurement Specification For Low Voltage Laminated Busbar", Siemens, Jun. 1996, Issue C.
"Mektron Busbars", Rogers n.v., Mektron Busbar Division, 1998.
"Mektron busbars", Mektron N.V., 1985.
"Specialty Materials for Customers Worldwide" brochure, Rogers, 1998.
"Corex™ Power Distribution Systems" brochure, Rogers, 1988.

* cited by examiner

*Primary Examiner*—Gregory Thompson
(74) *Attorney, Agent, or Firm*—Cantor Colburn LLP (57) ABSTRACT

The present invention relates to a bus bar assembly comprising a high power transistor module directly mounted to a bus bar. The bus bar has an improved solderability characteristic and is designed so that a solid, effective soldered connection results during a conventional soldering process in which the high power transistor module is securely mounted to the bus bar to form the bus bar assembly of the present invention. Accordingly, the soldering process involves soldering a pin which is a part of the high power transistor module to a surface of the bus bar using sufficient heat. The improved solderabilty of the present bus bar results by forming a soldering island in the bus bar at predetermined points thereof. The soldering island comprises a central soldering opening, which receives the soldering pin, and a plurality of thermal barrier openings distributed around the soldering opening.

11 Claims, 5 Drawing Sheets

BUS BAR ASSEMBLY

BACKGROUND OF THE INVENTION

1. Field of the Invention

The present invention relates to an assembly for providing an electrical connection between a high power transistor module and other electrical devices and more specifically relates to a bus bar assembly comprising a high power transistor module mounted to a multilayer laminated bus bar and to the method of connecting the two components.

2. Brief Description of the Related Art

Power distribution in modern electronic systems requires great care and consideration in configuring the distribution of several voltages and ground in electronic equipment. For example, a circuit board package in certain electronic equipment, such as middle- or large-scale computers, for instance, requires a supply of a large current of a predetermined voltage. It is common in many high-power applications for a high power transistor module, e.g., an integrated gate bipolar transistor (IGBT), to be provided. The IGBT modules are used featuring power electronic systems with high power density, high efficiency and good dynamic characteristics.

In mounting the IGBT modules to a power distribution system, the IGBT modules were in the past mounted on printed circuit boards (PCB's) by soldering the IGBT module on the PCB, In addition, it is known to package several IGBT's in one module for mounting on the electric distribution system. However, as electronic applications have evolved, these applications require higher and higher currents which prevent the IGBT modules from being mounted directly to printed circuit boards. As higher currents are realized, more heat is also generated by the IGBT modules and this heat disadvantageously results in operational problems for the PCB and the IGBT modules mounted thereto. Consequently, as the high power transistor modules continually increase the amount of current which passes therethrough, it is desirable to provide a new method of attaching high power transistors (IGBT modules) to electric distribution systems, especially when these high currents are used in the electric distribution systems.

SUMMARY OF THE INVENTION

The present invention relates to a bus bar assembly comprising a high power transistor module mounted to a multi layer laminated bus bar. Preferably, the high power transistor module comprises a module including at least one IGBT module having soldering pins which are received within corresponding soldering islands formed in the multi layer laminated bus bar to provide an effective and solid electrical connection therebetween.

In one exemplary embodiment, the multi layer laminated bus bar comprises a plurality of conducting plates and a plurality of conductive lugs, each disposed in either a first conducting plane or a second conducting plane. The plurality of conducting plates are arranged so that each plate is electrically connected to a corresponding positive or negative terminal of an electrical component, such as a high power transistor module which is easily mounted to the bus bar assembly. The plurality of lugs are arranged so that each lug is electrically connected to a phase terminal of the electrical component. The conducting plates and lugs are held in place in each respective plane by an electrically insulating outer coating which intimately encloses all of the conducting plates and lugs with the exception that an integral lug portion of each conducting plate and one end of the lugs extend beyond a peripheral edge at one side of the coating to define prongs which are intended to electrically connect the bus bar to an electrical device and provide power to the high power transistor module mounted thereto. Each conducting plate and lug is formed of a conductive material, e.g., copper with tinplating on outer surfaces thereof.

The conducting plates and lugs lying in the same plane are prevented from contacting one another by disposing the plates and lugs so that they are entirely separated from one another. Conducting plates and lugs in opposing planes are prevented from contacting one another by placing an inner insulating material between the planes. Consequently, each conducting plate or lug is prevented from contacting another, thereby eliminating a short circuiting event between two conducting surfaces. It being understood that the above described bus bar is merely exemplary in nature and other suitable bus bars may be used in accordance with the present invention.

In the present invention, the bus bar is designed to be directly mounted to the high power transistor module to form the bus bar assembly. To accomplish this the bus bar has an improved solderability characteristic and is designed so that a solid, effective soldered connection results during a conventional soldering process in which the high power transistor module is securely mounted to the bus bar to form the bus bar assembly of the present invention. Accordingly, the soldering process involves soldering a pin which is a part of the high power transistor module to a surface of the bus bar using sufficient heat. The improved solderabilty of the present bus bar results by forming a soldering island in each conducting plate and lug at a predetermined point thereof. The soldering island comprises a central soldering opening, which receives the soldering pin, and a plurality of thermal barrier openings distributed around the soldering opening. The soldering island itself is generally defined as the area extending between the thermal barrier openings and each soldering island serves to accelerate the heating up of the soldering surface by limiting the amount of heat dissipation in the soldering surface. Accordingly, the likelihood of a cold solder connection is eliminated or substantially alleviated by limiting heat dissipation during the soldering process, and a secure mounting connection is formed between the two components which form the bus bar assembly of the present invention.

The present invention permits the current higher power transistor modules to be directly mounted to the bus bar resulting in improved internal management of the high power transistor module in comparison with a more conventional PCB. Because the bus bar has an improved current carrying capacity resulting in the bus bar not heating up as much as a conventional PCB, the high power transistor module is better suited for mounting with the bus bar to provide an improved assembly.

The above-described and other features and advantages of the present invention will be appreciated and understood by those skilled in the art from the following detailed description and drawings.

BRIEF DESCRIPTION OF THE DRAWINGS

For the purpose of illustrating the invention, there are shown in the drawing forms which are presently preferred; it being understood, however that this invention is not limited to the precise arrangements and instrumentalities shown. Referring now to the drawings wherein like elements are numbered alike in the several Figures.

DETAILED DESCRIPTION OF THE INVENTION

Figure 1:
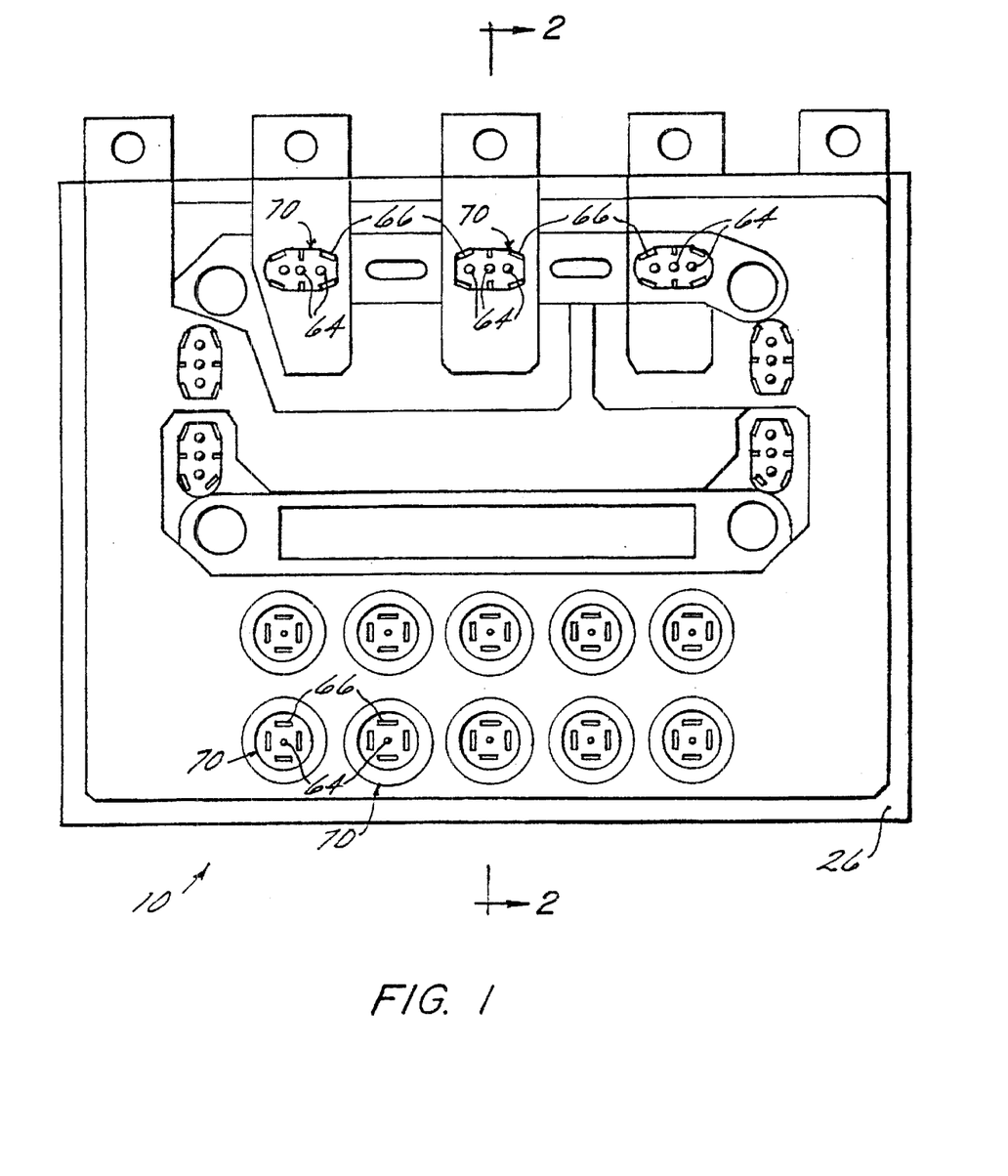
FIG. 1 is a top plan view of an exemplary bus bar assembly of the present invention.
Figure 2:
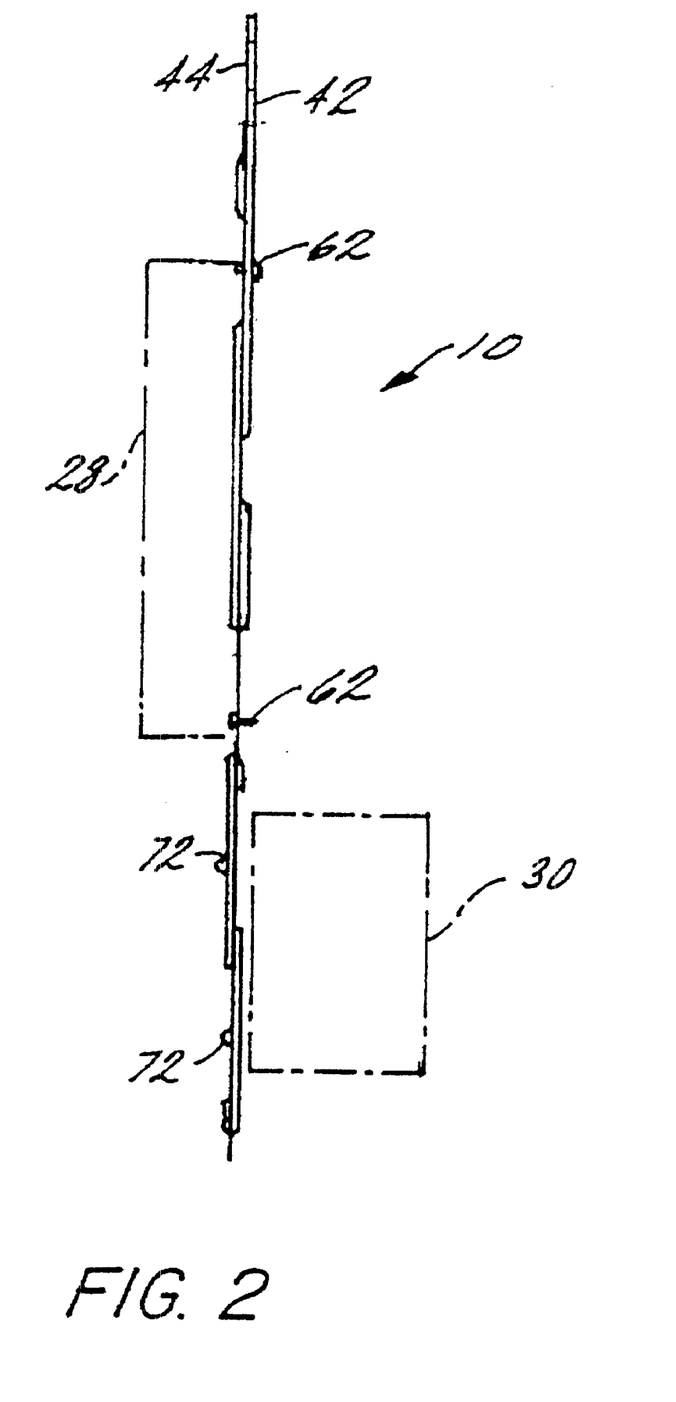
FIG. 2 is a cross sectional view taken along the line 2—2 of FIG. 1.
Figure 3:
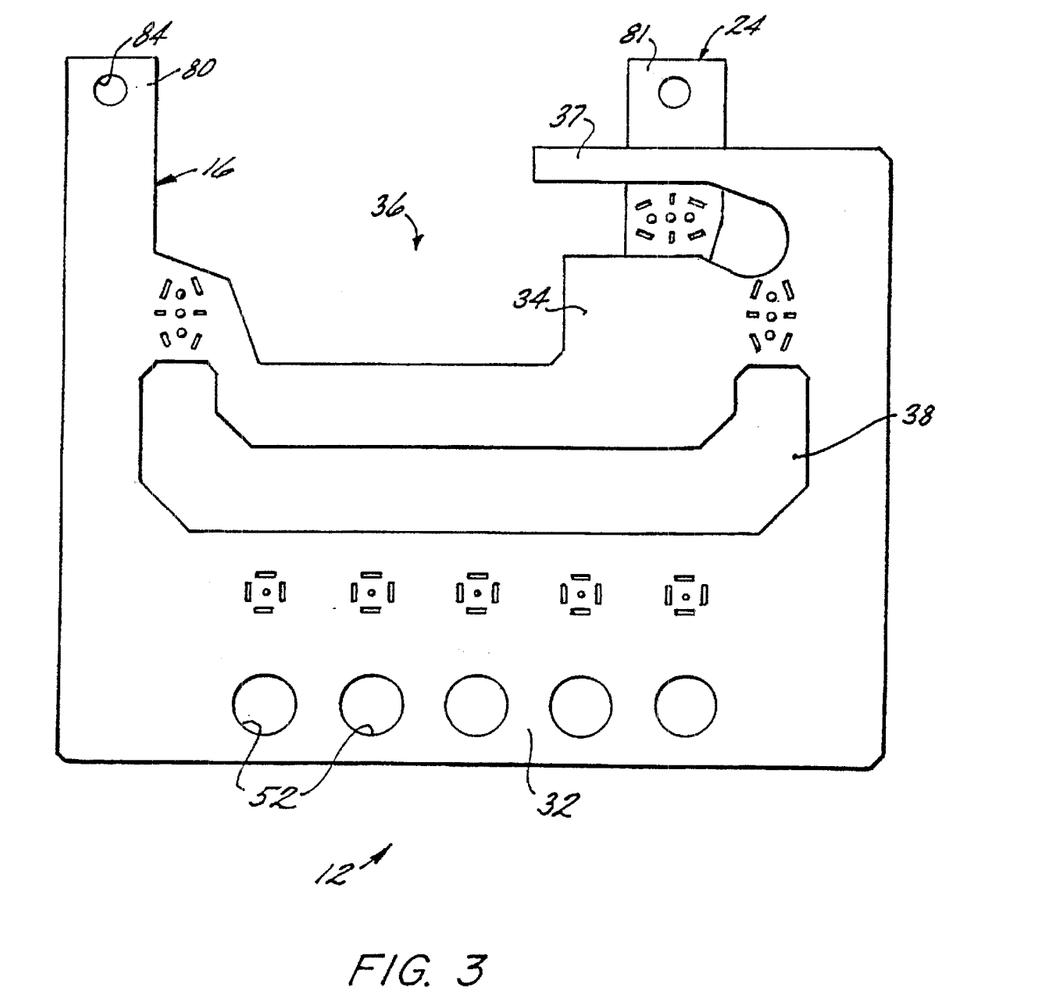
FIG. 3 is a top plan view of a first conducting plate and a first lug of the bus bar of FIG. 1.
Figure 4:
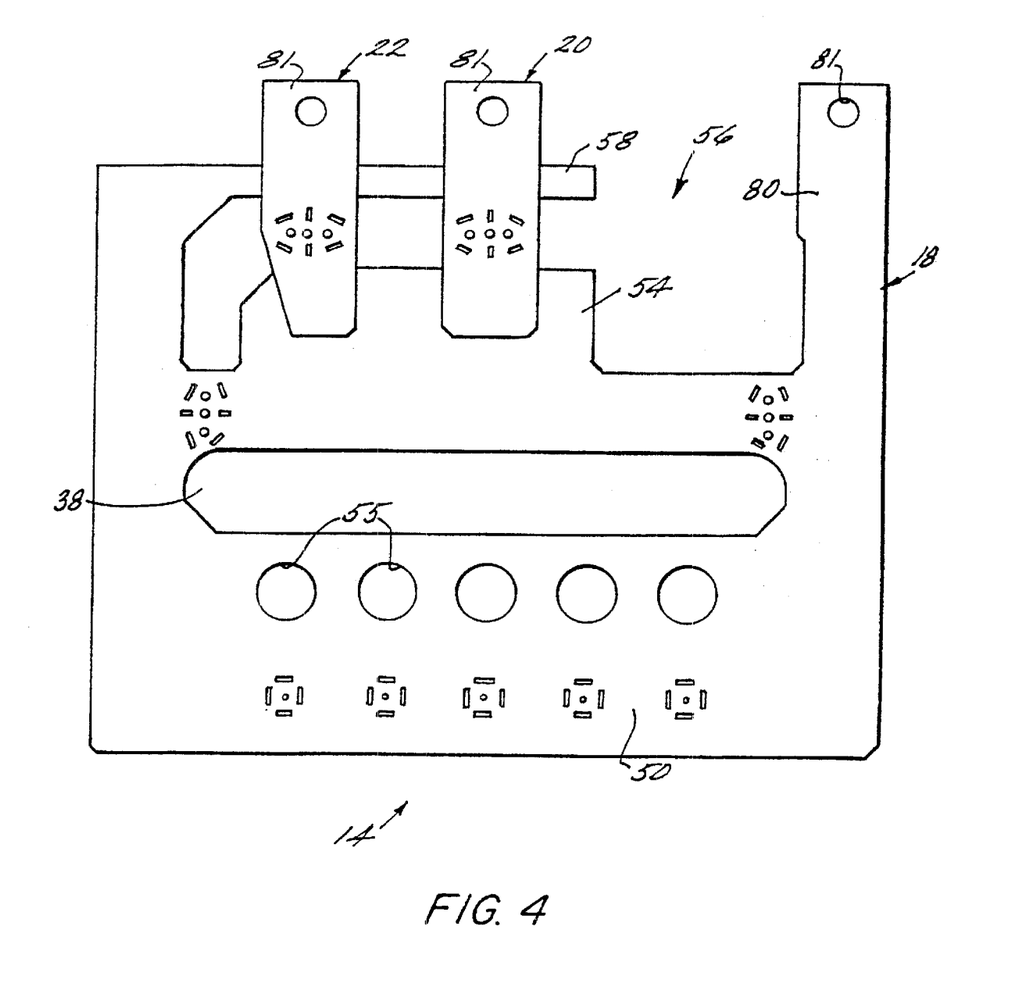
FIG. 4 is a top plan view of a second conducting plate and second and third lugs of the bus bar of FIG. 1.
Figure 6:
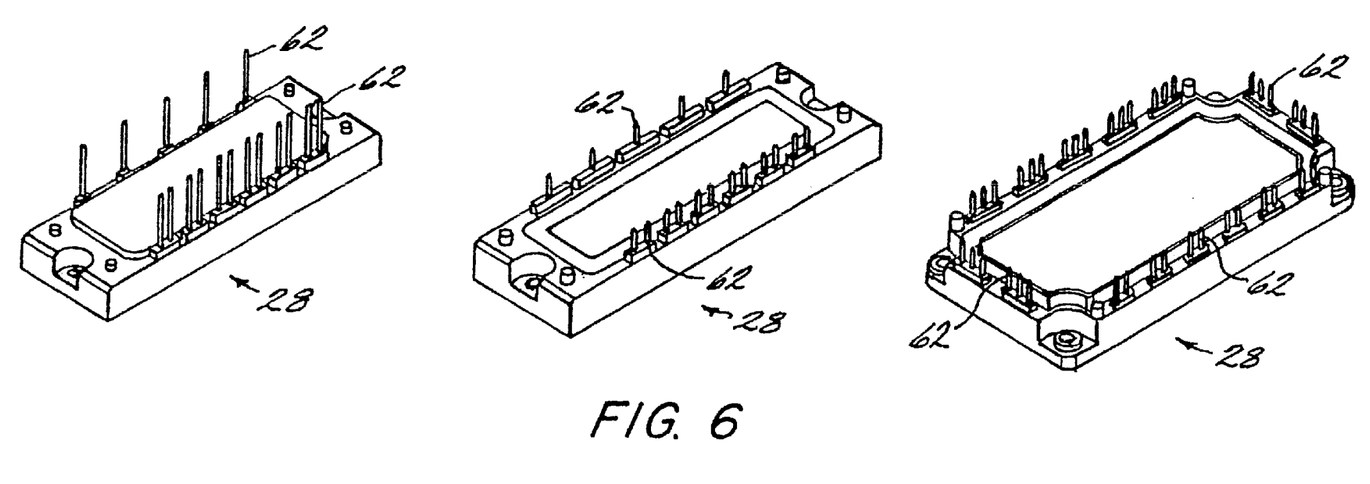
FIG. 6 is a perspective view of suitable high power transistor modules for use in the bus bar assembly of the present invention.

In accordance with the present invention, a bus bar assembly is provided, wherein a high power transistor module 28 is directly mounted to a suitable bus bar 10 in a manner described hereinafter. Turning to FIGS. 1–4 in which FIG. 1 is a top plan view of an exemplary multilayer bus bar for use in the assembly of the present invention and generally indicated at 10. Bus bar 10 comprises a multilayer laminated bus bar designed to provide an electrical connection between components of an electrical distribution system. As best shown in FIGS. 3–4, generally bus bar 10 comprises a plurality of electrical conductors which are insulated and incorporated into two planes, namely a first plane 12 and a second plane 14. It being understood that the plurality of conductors may be disposed in one, three, or even four planes and the two plane design of bus bar 10 is merely exemplary and illustrative in nature. The plurality of electrical conductors are in the form of bus bar conducting plates and conductive lugs. In the illustrated exemplary embodiment, the bus bar conducting plates comprise a positive conducting plate 16 and a negative conducting plate 18. It being understood that positive conducting plate 16 is connected to a positive voltage supply and negative conducting plate 18 is connected to a negative voltage supply. The conductive lugs comprise a first lug 20, a second lug 22, and a third lug 24 with the lugs generally comprising conductors corresponding to one of three phases of the electrical component mounted to bus bar 10. More specifically, first lug 20 represents one phase output of high power transistor module 28 and second and third lugs 22 and 24 represent the other two phase outputs of high power transistor module 28. In the exemplary bus bar 10, lugs 20, 22, and 24 comprise generally rectangular conducting plates; however, it is within the scope of the present invention that lugs 20, 22, and 24 and conducting plates 16 and 18 may take a variety of shapes. Bus bar conducting plates 16 and 18 and lugs 20, 22, and 24 are disposed either in first plane 12 or second plane 14 of bus bar 10, as will be described in greater detail hereinafter. The conducting plates and lugs within first and second planes 12 and 14 are held in place by a thermal conductor electrically insulating outer coating 26 which acts to properly position and secure each conducting plate and lug in relation to one another so that the proper electrical connection exists between each plate and lug and the corresponding electrical terminal on an electrical component which is mounted thereto. As shown in FIGS. 1–2, high power transistor module 28 is mounted to bus bar 10 directly, whereby bus bar 10 provides an the electrical connection between high power transistor module 28 and various electrical devices, e.g., electric motor, capacitors, etc. In an exemplary and preferred embodiment illustrated in FIG. 6, high power transistor module 28 comprises an electrical IGBT module component including soldering pins for connecting the module to another electrical component. More specifically, one preferred module 28 comprises a module having at least one IGBT and a plurality of solderable pins and is currently and commercially referred to as an Econo module or Econopack. The Econo module product family is commercially available from Siemens HL and eupec GmbH and generally, the Econo module product family comprises a high economy converter product having different combinations of rectifier diodes and IGBTs with or without parallel or serial fast diodes for a wide power range.

Turning back to FIGS. 1–4, in addition to having high power transistor module 28 mounted thereto, a plurality of capacitors 30 are connected to bus bar 10 shown in FIG. 2. As is known in the art, bus bar 10 is intended to provide a power distribution system component to high power transistor module 28 and the plurality of capacitors 30.

In an exemplary embodiment, first plane 12 includes positive conducting plate 16 and first and second lugs 20 and 22, wherein positive conducting plate 16 extends along a substantial portion of first plane 12. Positive conducting plate 16 includes a first section 32 in which contact is made between one end of each capacitor 30 and the positive conducting plate 16 to provide an electrical connection therebetween.

At a second section 34, positive conducting plate 16 includes a cut-away recess portion 36 so that first and second lugs 20 and 22 may be received and disposed within cut-away recess portion 36. It being noted that first and second lugs 20 and 22 are received in cut-away recess portion 36 but are separated and do not electrically contact any portion of plus conducting plate 16. As shown, first and second lugs 20 and 22 comprise substantially rectangular conducting plates which electrically connect with corresponding phase terminals (not shown) in high power transistor module 28.

Integrally formed in positive conducting plate 16 is an arm section 37 which extends inward from a peripheral edge of positive conducting plate 16 toward cut-away recess portion 36. Intermediate first section 32 and second section 34 of plus conducting plate 16 is a pass-through opening 38 to permit gate connections between high power transistor module 28 and another electrical device. As shown in FIG. 2, pass-through opening 38 permits a plurality of solderable pins 62 to extend therethrough.

Second plane 14 includes minus conducting plate 18 and third lug 24, wherein negative conducting plate 18 extends along a substantial portion of second plane 14. At a first section 50, negative conducting plate 18 receives the other end of each of the plurality of capacitors 30 to provide an electrical connection between negative conducting plate 18 and plurality of capacitors 30.

At a second section 54, negative conducting plate 18 includes a cut-away recess portion 56 so that third lug 24 may be received and disposed in cut-away recess portion 56 and electrically connected to a corresponding electrical terminal in high power transistor module 28. It being noted that while third lug 24 is received in cut-away recess portion 56, it does not electrically contact any portion of negative conducting plate 18. As shown and similar to first and second lugs 20 and 22, third lug 24 comprises a substantially rectangular conducting plate which is connected to one of the three phase terminals of high power transistor module 28. Negative conducting plate 18 also includes an arm section 58 which extends inward from a peripheral edge of negative conducting plate 18 toward cut-away recess portion 56. Similar to positive conducting plate 16, negative conducting plate 18 includes a plurality of openings 55 which provide access to a plate disposed in the first plane 12. Intermediate first section 50 and second section 54 of negative conducting plate 18 is a pass-through opening 38 which is preferably aligned with pass-through opening 38 formed in positive conducting plate 16 when both plates 16 and 18 are assembled together and positioned relative to one another by coating 26.

As shown in FIG. 3, positive conducting plate 16 includes a plurality of openings 52 in first section 32 which provide access to a conducting plate disposed in second plane 14 and more specifically permit the other ends of each capacitor 30 to be electrically connected to both positive conducting plate 16 and a plate disposed in second plane 14, e.g., negative conducting plate 18.

In accordance with the present invention, a layer of inner electrically insulating material (not shown) is disposed between first plane 12 and second plane 14 and more specifically, inner electrically insulating material is disposed between positive conducting plate 16, first lug 20, second lug 22, all of first plane 12 and negative conducting plate 18 and third lug 24 of second plane 14. Inner electrically insulating material comprises any suitable insulating material which may or may not be the same material as outer insulating coating 26. In an exemplary embodiment, inner electrically insulating material comprises a polyamid material known as a Kapton material which is commercially available under the tradename R/FLEX from Rogers Corporation, Rogers, Conn.; a high temperature resistant paper-like produce commercially available under the tradename NOMEX from Dupont; or a polyester material which is commercially available from Rogers Corporation under the tradename DUROID. Inner electrically insulating material may take a variety of cut shapes, so long as it serves to insulate the plate and lugs disposed in first plane 12 from the plate and lug disposed in second plane 14. Electrically insulating outer coating 26 also comprises an electrically insulating material which may or may not be the same as the inner electrically insulating material. In bus bar 10, the thickness of electrical insulating coating 26 is about 0.075 mm. The thickness of inner electrically insulating material may be approximately the same thickness as insulating outer coating 26 and accordingly, in one embodiment, the thickness is about 0.075 mm. It being understood that the thickness of insulating outer coating 26 and inner insulating material may vary depending upon the precise material which is used for these layers.

Figure 5:
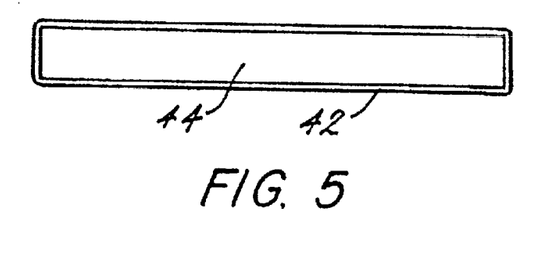
FIG. 5 is a cross sectional end view of either a conducting plate or a conductive lug of the bus bar of FIG. 1.

As best shown in FIG. 5, each of conducting plates 16 and 18 and lugs 20, 22, and 24 comprises a multilayer structure having in one embodiment an outer conductive surface 42 and a conductive inner material 44. Outer surface 42 and inner conductive material 44 both comprise conductive materials and in an exemplary embodiment, outer surface 42 comprises a tin plating layer having a minimum thickness of about 3 $\mu$m. Tin plated outer surface 42 facilitates the soldering of high power transistor module 28 to bus bar 10. Conductive inner material 44 preferably comprises copper having a thickness between about 0.5 mm and about 1.5 mm and more preferably about 0.8 mm. The outer surface 42 formed by a tin plating process provides durability to the inner copper material 44 and decreases the likelihood that the copper will corrode over time during exposure to the elements. The precise thickness of the copper depends upon the required current which will pass through bus bar 10 to power high power transistor module 28 and the plurality of capacitors 30. It being understood that the above-recited dimensions are listed for purpose of illustration only and do not limit the scope of the present invention and that the conducting plates and lugs of the present invention may comprise a single conductive layer structure. Furthermore, it is within the scope of the present invention that nickel plating layer may be used instead of the tin plating layer and in an alternative embodiment, outer surface 42 comprising a plating layer may be entirely eliminated.

Now turning back to FIGS. 1–4, any overlapping and contact between plates 16 and 18 and lugs 20, 22, and 24 is prevented by the placement in the same plane of each plate and lug and by inner electrically insulating material which prevents contact between positive conducting plate 16, first and second lugs 20 and 22 of first plane 12 and negative conducting plate 18 and third lug 24 of second plane 14. Thus, the conductive layer which forms outer surface 42 for any one plate and lug is prevented from contacting the conductive layer of another plate and/or lug. Therefore, short circuiting between the plates, lugs, and high power transistor module 28 is prevented by the elimination of having two conducting layers abutting each other in bus bar 10.

As shown in the Figures, each plate includes an integral lug portion 80 disposed between outer coating 26 and extending away from a peripheral edge of outer coating 26. Integral lug portion 80 of each plate permits the plate to be easily electrically connected to the power supply and each integral lug portion 80 includes an opening 84 for connecting bus bar 10 to a power distribution system, which may include a second bus bar component. Each of lugs 20, 22, and 24 include a connection portion 81 at one end of each lug. Integral lug portion 80 and connecting portion 81 permit power to be supplied/removed to a specific, predetermined electrical terminal of high power transistor module 28 from the power distribution system by providing a network or path, defined by each individual conducting plate and lug, for the electricity to flow from a power supply (not shown) to high power transistor module 28. It being noted that integral lug portion 80 and connecting portion 81 do not include inner electrically insulating material on an outer surface 42 thereof.

Disposed across and in contact with an inner surface of arm section 37 of positive conducting plate 16 are integral lug portion 80 of negative conducting plate 18 and connecting portion 81 of third lug 24. Arm section 37 provides structural rigidity to bus bar 10 and more specifically to positive conducting plate 16 and third lug 24 by having plate 16 and third lug 24 lay across arm section 37 prior to enclosing all of the plates and lugs within coating 26. Likewise, arm section 58 of negative conducting plate 18 provides structural support and rigidity to bus bar 10 and more specifically to integral lug portion 80 of positive conducting plate 16 and connecting portions 81 of first and second lugs 20 and 22. It being understood that the above-described bus bar 10 is described for purpose of illustration only and it within the scope of the present invention that other suitable bus bars may be used in combination with the high power transistor module 28 to form the bus bar assembly of the present invention.

In the present invention, bus bar 10 is designed so that high power transistor module 28 is easily and securely mounted thereto via an electrical connection which eliminates the need and use of a PCB and eliminates the need and use of screw-type connectors commonly used to mount an electrical component to a conventional bus bar. Thus, the present bus bar assembly also permits the high power transistor module 28 to be used in combination with bus bar 10 instead of being used in combination with a PCB, wherein the high power transistor is mounted to the PCB using conventional methods. The use of bus bar 10, instead of a PCB, in combination with high power transistor module 28 offers several notably advantages including that bus bar 10 has a larger cross section which heats less when used in combination with high power transistor module 28. For example, the Econo module currently available offers a low cost transistor module package which over time has continually increased its current capacity so that now the module is no longer a low power device. As the power has increased in the Econo module, the heat generated by the increase in current flow has also increased. This has led to several problems when the Econo module is mounted to the PCB as is conventionally done. More specifically, a conventional PCB has a relatively thin cross section resulting in a limited current carrying capacity and when high power transistor module 28 is mounted thereto, the increased heat generated by module 28 causes operational difficulties in the PCB. Consequently, the internal management of the Econo module suffers from this deficiency.

In contrast and in accordance with the present invention, the mounting of high power transistor module 28 to bus bar 10 overcomes these deficiencies because of the increased cross section of bus bar 10 and more specifically, the increased thickness of the conducting plates and lugs forming bus bar 10 permit more current to be carried and can thus accommodate the increased power of the newer Econo modules. Also, the increased cross section of bus bar 10 results in bus bar 10 not heating up as much as a conventional PCB, and thus permits full operation of high power transistor module 28.

Some of the earlier electrical module components were provided with screw connections to permit mounting to the power distribution system, which typically comprised a conventional bus bar or in the alternative the module components were mounted to a PCB. In contrast and in accordance with the present invention, the more recent high power transistor module 28 for use with bus bar 10 is mounted to bus bar 10 via a plurality of soldered connections in which a plurality of solderable pins 62 of high power transistor module 28 are soldered to bus bar 10 forming an electrical connection therebetween and providing the bus bar assembly of the present invention.

Thus in accordance with the present invention and as shown in FIGS. 1–2, bus bar 10 has a plurality of soldering openings 64 and a plurality of thermal barrier openings 66 formed therein. In the exemplary embodiment shown in FIGS. 1–2, soldering openings 64 are generally circular in nature and thermal barrier openings 66 comprise a number of rectangular openings positioned at predetermined locations around each soldering openings 64 to form a soldering island, generally indicated at 70. Soldering openings 64 are receptive to solderable pins 62 of high power transistor module 28. Soldering islands 70 are used to facilitate the soldering of both the plurality of capacitors 30 and high power transistor module 28 to bus bar 10. In the exemplary bus bar 10 shown in FIGS. 1–3, each capacitor 30 has a soldering pin 72 at a first and a second end thereof, wherein soldering pin 72 at the first end is received in one soldering opening 64 formed in first section 32 of positive conducting plate 16 and because first section 50 of the negative conducting plate 18 includes opening 55 located directly below soldering opening 64, soldering pin 72 freely passes through this opening 64 and access for soldering the soldering pin 72 to positive conducting plate 16 is provided. Soldering pin 72 at the opposing second end of each capacitor 30 passes through openings 52 in first section 32 of positive conducting plate 16 and through soldering openings 64 provided on first section 52 of negative conducting plate 18 to provide an electrical connection therebetween.

After disposing solderable pins 72 within corresponding soldering openings 64 of conducting plates 16 and 18, the electrical connection between the plurality of capacitors 30 and outer surfaces 42 of positive conducting plate 16 and negative conducting plate 18, respectively, is typically done by a soldering process. Solderable pins 72 of the plurality of capacitors 30 are soldered to the positive and negative conducting plates 16 and 18, respectively. In accordance with the present invention, the plurality of thermal barrier openings 66 are provided around each soldering opening 64 to create soldering island 70. The plurality of thermal barrier openings 66 comprise a number of rectangular openings purposely positioned around each soldering opening 64 to form soldering island 70 which comprises an area extending between the spaced plurality of thermal barrier openings 66. For the electrical connection between the plurality of capacitors 30 and the positive and negative plates 16 and 18, each soldering island 70 is defined by four thermal barrier openings 66 which surround a single soldering opening 64.

In the case of the electrical connection between high power transistor module 28 and bus bar 10 of the present invention, a plurality of soldering islands 70 are provided with a plurality of soldering openings 64 which receive the plurality of solderable pins 62 of high power transistor module 28. In the case of the exemplary bus bar 10 shown in the Figures, the plurality of solderable pins 62 associated with an individual terminal of high power transistor module 28 are soldered to one of plates 16 and 18 and lugs 20, 22, and 24 after the plurality of solderable pins 62 pass through the corresponding plurality of soldering openings 64 on each plate and are then soldered to the plate itself using a conventional soldering process. For the electrical connection between high power transistor module 28 and plates 16 and 18 and lugs 20, 22, and 24 of bus bar 10, each soldering island 70 is defined by six thermal barrier openings 66 which surround three soldering openings 64 which receive three solderable pins 62.

By incorporating soldering islands 70 into each plate and lug of bus bar 10, the effectiveness of the soldering process is greatly improved. As is known, during the soldering process, the surface area which abuts the plurality of solderable pins 62 and 72 and which acts as a soldering surface needs to be heated to a sufficiently high temperature to permit the solder to connect the plurality of solderable pins 62 and 72 to the soldering surface of each plate and lug of bus bar 10. Generally, this soldering surface needs to be heated to a temperature greater than the melting point of the solder to produce an effective soldering surface which permits the solder to melt and bond the plurality of solderable pins 62 or 72 to the respective conductive plate and lug of bus bar 10. If the soldering surface has not attained a sufficiently high temperature, what is known in the art as a "cold solder" is likely to occur, whereby the solder does not bond sufficiently to the soldering surface and a weak bond is created between the solderable pins and the soldering surface to which they are soldered. Over time and during normal operation, the components liked together with a cold solder will begin to separate due to the weak bond at the point of soldering. Consequently, the electrical connection formed through the soldered connection will degrade and in the worse case will fail.

The present invention overcomes these deficiencies and others by providing a thermally isolated area which advantageously accelerates the heating up of the soldering surface. This thermally isolated area is referred to herein as soldering island 70. Each soldering island 70 is defined by and is created by the placement of the plurality of thermal barrier openings 66 around the plurality of soldering openings 64 which receive either the plurality of solderable pins 62 or 72. Each soldering island 70 is defined as the area extending between the plurality of thermal barrier openings 66, wherein the plurality of thermal barrier openings 66 are located around at least one soldering opening 64. The plurality of thermal barrier openings 66 serve as thermal barriers which accelerate the heating up of the soldering surface by limiting the amount of heat dissipation in the soldering surface. Because the soldering surface comprises a limited area of one conducting plate of bus bar 10, the entire conducting plate with its surface area dissipates heat which is applied to only a limited area of the entire surface, namely the soldering surface. This is disadvantageous to producing a solid solder connection and increases the likelihood that a cold solder will occur because the soldering surface can not reach a sufficiently high temperature to permit a proper solder connection due to heat dissipation along the entire surface of the conducting plate.

The precise configuration of the plurality of soldering islands 70 shown in the FIGS. 1–4 is only for illustration and is exemplary in nature and it is within the scope and intent of the present invention that the plurality of thermal barrier openings 66 may be arranged in a number of ways to define and create the plurality of soldering islands 70 depending upon the precise application and the soldering temperature which is needed to be realized in order to provide an effective solder connection.

Accordingly, the bus bar assembly of the present invention permits high power transistor module 28 to be effectively used in combination with bus bar 10 to form an electrical assembly for use in a variety of applications.

While preferred embodiments have been shown and described, various modifications and substitutions may be made thereto without departing from the spirit and scope of the invention. Accordingly, it is understood that the present invention has been described by way of illustrations and not limitation.

What is claimed is:

1. A bus bar assembly, comprising:
    bus bar comprising at least one plate, said plate comprising at least one conductive lug;
    a soldering opening formed in the bus bar;
    a thermal barrier opening formed in the bus bar proximate said soldering opening, wherein a plurality of thermal barrier openings in combination with the soldering opening define a solderings island; and
    a high power transistor module mounted to the bus bar, the high power transistor module having a plurality of solderable pins electrically connecting the high power transistor module to the bus bar, wherein each solderable pin is disposed within a corresponding soldering opening formed in the bus bar.

2. The bus bar assembly as set forth in claim 1, further comprising an electrically insulating material disposed at said bus bar to prevent said plate or said conductive lug of the plate from contacting a second plate or a conductive lug of the second plate.

3. The bus bar assembly set forth in claim 2, further comprising:
    a thermally conductive, electrically insulating outer coating disposed at said bus bar such that a peripheral edge of said bus bar and an integral lug portion of said bus bar extend beyond a peripheral edge of the outer coating.

4. The bus bar assembly set forth in claim 1, wherein the soldering island comprises said soldering opening surrounded by four thermal barrier openings arranged as two opposing pairs of thermal barrier opening and forming a generally rectangular soldering island with the soldering opening being centrally located.

5. The bus bar assembly set forth in claim 1, further comprising:
    a capacitor mounted to the bus bar, said capacitor having a first soldering pin at a first end and a second soldering pin at a second end, the first soldering pin being received at said plate and the second soldering pin being received at a second plate of said bus bar.

6. The bus bar assembly set forth in claim 1, wherein the soldering opening is generally circular in nature and the thermal barrier openings are generally rectangular.

7. The bus bar assembly set forth in claim 1, wherein the soldering island comprises three soldering openings surrounded by six thermal barrier openings.

8. The bus bar assembly set forth in claim 1, wherein each of said plates and each of said conductive lugs comprise a copper layer having tin plating disposed on outer surfaces of said copper layer.

9. The bus bar assembly as set forth in claim 3, wherein the thermally conductive electrically insulating outer coating comprises a polymeric material.

10. A bus bar assembly, comprising:
    a bus bar comprising at least one plate and at least one conductive lug disposed at said plate;
    a solderable opening formed in said bus bar;
    a thermal barrier opening formed in said bus bar at said solderable opening, wherein said barrier opening in combination with said solderable opening defines a soldering island; and
    an electrical device mounted to said bus bar.

11. A bus bar assembly, comprising:
    a bus bar comprising at least one plate and at least one conductive lug disposed at said plate;
    a solderable opening formed in said bus bar; and
    a thermal barrier opening formed in said bus bar at said solderable opening, wherein said thermal barrier opening in combination with said solderable opening defines a soldering island.

* * * * *